(12) United States Patent
Verdiell

(10) Patent No.: US 6,252,726 B1
(45) Date of Patent: Jun. 26, 2001

(54) DUAL-ENCLOSURE OPTOELECTRONIC PACKAGES

(75) Inventor: Jean-Marc Verdiell, Palo alto, CA (US)

(73) Assignee: Lightlogic, Inc., Newark, CA (US)

(*) Notice: Subject to any disclaimer, the term of this patent is extended or adjusted under 35 U.S.C. 154(b) by 0 days.

(21) Appl. No.: 09/389,864

(22) Filed: Sep. 2, 1999

(51) Int. Cl.$^7$ ................. G02B 7/02; G02B 6/36; H01S 3/04

(52) U.S. Cl. ............... 359/820; 372/34; 385/88; 385/92; 385/94

(58) Field of Search ............... 359/820; 372/34, 372/36; 385/88, 92, 94, 137

(56) References Cited

U.S. PATENT DOCUMENTS

| | | |
|---|---|---|
| 3,908,184 | 9/1975 | Anazawa . |
| 4,114,177 | 9/1978 | King ........................... 257/81 |
| 4,119,363 | 10/1978 | Camlibel et al. .................. 385/84 |
| 4,233,619 | 11/1980 | Webb et al. ..................... 257/680 |
| 4,357,072 | 11/1982 | Goodfellow et al. .............. 385/91 |
| 4,893,901 | 1/1990 | Taumberger ..................... 359/894 |
| 4,926,545 | 5/1990 | Pimpinella et al. ................ 29/832 |
| 5,011,256 * | 4/1991 | Johnson et al. ................... 385/96 |
| 5,119,448 | 6/1992 | Schaefer et al. ................... 385/4 |
| 5,123,074 | 6/1992 | Yokota et al. .................... 385/89 |
| 5,163,108 | 11/1992 | Armiento et al. ................. 385/95 |
| 5,610,395 | 3/1997 | Nishiyama ..................... 250/239 |
| 5,619,609 | 4/1997 | Pan et al. ....................... 385/136 |
| 5,641,984 | 6/1997 | Aftergut ........................ 257/433 |
| 5,930,430 * | 7/1999 | Pan et al. ........................ 385/94 |
| 6,027,256 * | 2/2000 | Nightingale et al. ............... 385/92 |

* cited by examiner

Primary Examiner—Georgia Epps
Assistant Examiner—David N. Spector
(74) Attorney, Agent, or Firm—Blakely, Sokoloff, Taylor & Zafman LLP (57) ABSTRACT

A package for housing optical components where the enclosure has two enclosures. The first enclosure for the optical components (the optical enclosure) provides necessary alignment and hermeticity as well as a heat pipe to dissipate heat generated by the optical component. The second enclosure for the electronic components (the electronic enclosure) provides proper hermeticity and heat dissipation devices (e.g., a Peltier cooling device). The first enclosure can sit atop the second enclosure or vice versa. In an embodiment, a heat sink can be attached to the top of the dual-enclosure assembly.

58 Claims, 4 Drawing Sheets

DUAL-ENCLOSURE OPTOELECTRONIC PACKAGES

FIELD OF THE INVENTION

The invention relates to packages for both optical and electronic components. More particularly, the invention relates to packages having dual enclosures for housing optical and electronic components.

BACKGROUND OF THE INVENTION

As optical components have become increasingly integrated with electronic components, packages for optoelectronic devices have been developed. Individually, optical component packages and electronic component packages have been designed to solve different packaging problems. For example, optical components must be carefully aligned and the alignment must be maintained for proper functionality.

Optoelectronic packaging usually must adhere to a number of constraints. One constraint is that any heat generated within a package must be removed while not interfering with the electronics and optics in the package, including their respective interfaces to the package. In the prior art, the thermal path usually interferes with the electrical path. For example, in a standard butterfly package, heat is generated and migrates down to the bottom of the package while electrical connections are at mid-height along the side of the package. This is impractical for standard printed circuit board mounting. Another constraint on optoelectronic packages is that most WDM optoelectronics require temperature control (e.g., wavelength control of transmitting lasers, heat dissipation of pumps). Without the necessary temperature control, difficulties may arise in controlling the wavelength of transmitting lasers. Similarly, without temperature control, the proper dissipation of heat from, for example, pump lasers, could cause problems. Thirdly, another constraint on optoelectronic packages is that active optoelectronic chips, such as a laser diode in particular, require a low outgasing hermetic enclosure. That is, the entire assembly in that enclosure cannot have glue and soldering must be performed without using flux. This is extremely difficult to do from a manufacturing standpoint.

Because of the many constraints on optoelectronic packages, current optoelectronic packages are large, expensive and difficult to manufacture. What is needed is an improved optoelectronic package.

SUMMARY OF INVENTION

A dual-enclosure optoelectronic package is described. The package includes a first enclosure having at least one optical component and a heat pipe to direct heat away from the optical component and a second enclosure thermally coupled to the first enclosure and having at least one heat dissipation device to dissipate heat away from the first enclosure.

BRIEF DESCRIPTION OF THE DRAWINGS

The invention is illustrated by way of example, and not by way of limitation in the figures of the accompanying drawings in which like reference numerals refer to similar elements.

DETAILED DESCRIPTION

A dual-enclosure optoelecironic package is described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Overview

A package for housing optoelectronic and/or optical components (e.g., laser diode, lenses, fibers, etc.) using dual enclosures is described. A first enclosure contains optical components with the necessary alignment, hermeticity, and low outgasing environment to create a high-reliability optoelectronic assembly. The first enclosure also includes a heat pipe or other heat dissipation device to dissipate heat generated by the component therein and channel that heat to another enclosure. A second enclosure includes one or more additional heat dissipation devices (e.g., a Peltier cooling device). The second enclosure is thermally and mechanically coupled to the first enclosure. In one embodiment, the second enclosure sits atop the first enclosure, or vice versa.

Because the second enclosure does not include optical components, outgasing materials may be used for assembly. In other words, the use of fluxless, orgranic-less assembly materials is or can be limited to one enclosure containing only the critical optical elements (e.g., a laser diode and coupling optics), while the cooling (and often electronics) can be mounted in the second enclosure using glue or standard soldering with flux, which is much easier from a manufacturing standpoint. Because the second enclosure does not contain sensitive optical elements, the second enclosure's hermeticity requirements might be different from that of the first enclosure.

A heat sink or other heat dissipation device is coupled to the dual-enclosure assembly. In one embodiment, a heat sink is coupled to the second enclosure to dissipate heat generated by the first enclosure that has been transferred to the second enclosure.

In an embodiment, the dual-enclosure assembly can be mass produced at low cost while maintaining precision alignment of optical components, including optical fibers or portions thereof, within the optical enclosure.

Figure 1:
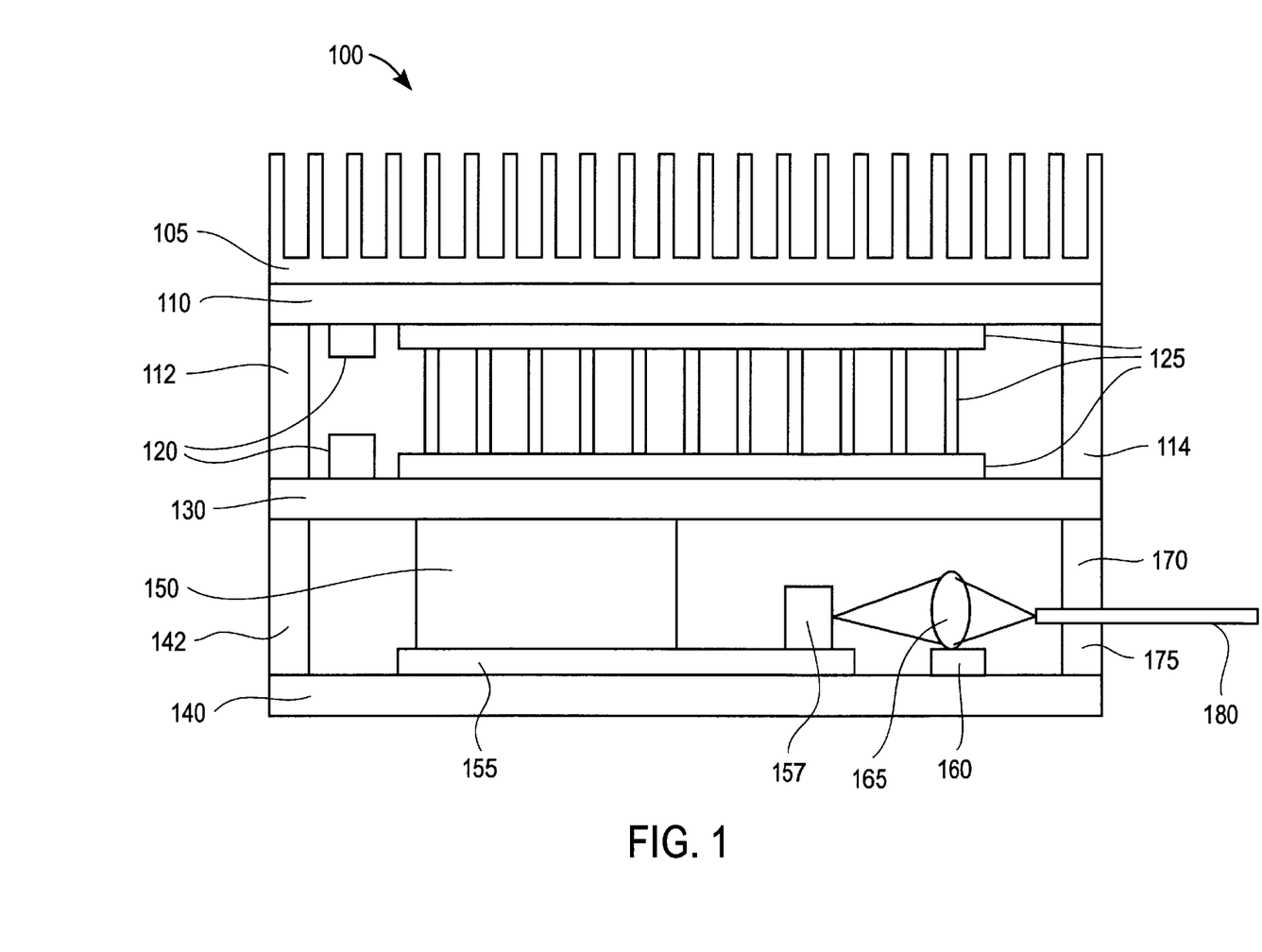
FIG. 1 is a side-section view of one embodiment of an optoelectronic package.

FIG. 1 is a side-section view of one embodiment of an optoelectronic package. Referring to FIG. 1, assembly 100 is a dual enclosure optoelectronic package housing optical components, along with one or more heat dissipation devices, in a lower enclosure and at least one heat dissipation device in an upper enclosure.

Optoelectronic package 100 is built upon substrate 140 that provides a floor for the optical enclosure. In one embodiment, substrate 140 is a very low expansion material (e.g., alumina ceramic) and provides good mechanical stability. Optical fiber 180 communicates optical signals between components in the lower enclosure of package 100 and external devices (not shown in FIG. 1). In one embodiment, optical fiber 180 passes through an opening formed between side walls 170 and 175. Alternatively, a tube or hole can be provided in a singlepiece wall. The opening through which optical fiber 180 passes can be sealed in any manner known in the art to provide the desired hermeticity. Instead of an optical fiber, other hermetic optical interfaces can be used such as, for example, a window or a lens sealed inside the wall, or a hermetic optical connector housing. The optical enclosure also includes side wall 142.

In one embodiment, within the lower enclosure, a heat spreader 155 rests on substrate 140. Heat spreader 155 supports component 157 (e.g., a laser diode) and distributes heat from component 157 across a larger surface. In addition, heat spreader 155 may provide height adjustment to bring component 157 into optical alignment and might also provide electrical contacts for component 157 when component 157 is an active opto-electronic element (e g., a laser diode). Heat pipe 150 rests on and is thermally and mechanically coupled to heat spreader 155 and channels heat from heat spreader 155 to assembly mid-piece 130, which operates as the ceiling of the lower enclosure and the floor of the upper enclosure In one embodiment, support 160 also rests on substrate 140. Support 160 provides proper alignment for component 160 (e.g., a lens), such that optical data is transmitted to optical fiber 180 from device 157. While the embodiment of FIG. 1 includes two optical components (i.e., 157 and 165) any number of optical components can be included in the optical enclosure.

In one embodiment, heat spreader 155 and/or support 160 are submounts made of a high thermal conductivity material, such as, for example, copper tungsten, aluminum nitride, berillyum oxide, or boron nitride. Heat spreader 155 and/or support 160 can be attached, for example, by soldering or brazing, or may even be part of the substrate material itself.

In one embodiment, component 157 may comprise an edge emitting, side mounted, or waveguide device, such as, for example, a laser diode, a modulator, a detector, mounted on heat spreader 155 and/or support 160. Mirco-optical elements such as, for example, micro-lenses, filters, splitters, isolators, may be mounted directly on substrate 140 and/or support 160.

In one embodiment, the height of heat spreader 155 and/or support 160 and the height of the optical components are chosen such that the optical components 157 and 163 are vertically aligned (i.e., their optical axis lies in a common plane parallel to the floor of the first enclosure).

In one embodiment, the height of heat spreader 155 and/or support 160 is a small fraction (e.g., <1/10) of the length of substrate 140, so that assembly is essentially two dimensional and can be manufactured using pick and place automation. Using high precision automated pick and place assembly, the optical relationship between the optical components can be established in the lateral and transverse dimensions within a few microns of precision. The height alignment between the components is set by the height of heat spreader 155 and/or support 160. Using precise control of the materials or a polishing technique, the height of heat spreader 15 and/or support 160 can be controlled to within ten microns or less.

In one embodiment, distribution of electrical signals to pins outside the lower enclosure from interior components is accomplished by a set of vias through the bottom of substrate 140. In one embodiment, the vias comprise hermetically filled vias. In an alternative embodiment, electrical connections are provided by a set of lines printed directly on the top and bottom of substrate 140 as a set of patterns. The top and bottom electrically conductive patterns are electrically connected by the vias. By having the heat dissipate through the top of the package and having the electrical connections through the bottom of the package, the electrical path and the thermal path do not substantially interfere with each other. Therefore, the package may be mounted on a printed circuit board (PCB) like any other electronic component. Also, this allows the electrical connections to the PCB to be much shorter, which provides for better high-speed performance. Using the vias, signals from the lower enclosure may be distributed to pins at the periphery of the package, to a ball grid array, or similar structure, underneath the package without any additional wiring or through-wall hermetic feedthroughs. This configuration is advantageous for high speed connections because the vias are short (e.g., less than approximately 1 mm) and wire lengths are reduced, which reduces parasitic capacitance and inductance that would otherwise limit the speed of operation. For example, when component 157 comprises a laser diode, its connection through substrate 140 may be a very short high speed connection (e.g., 1–2 mm).

Substrate 140, side walls 142, 170 and 175, and assembly mid-piece 130 are assembled in any manner known in the art to provide the proper hermeticity for the optical components. In one embodiment, the lower enclosure has a high hermeticity and is organic-less and flux-less to control outgasing. In one embodiment, the leak rate of the lower enclosure is less than or equal to $10^{-8}$ atm/cc.s. In one embodiment, side walls 142, 170 and 175 and mid-piece 130 comprise an single piece of material that operates as a cap over substrate 140. In one embodiment, mid-piece 130 comprises a ceramic substrate. The upper enclosure is then assembled providing the proper hermeticity for the cooling and electronic components. The upper enclosure can be assembled with glues (e.g., epoxies), flux, etc. In one embodiment, the hermeticity of the upper enclosure is a low hermiticity and is also lower than that of the lower enclosure. In one embodiment, the leak rate for the upper enclosure is less than or equal to $10^{-5}$ atm/cc.s. Alternatively, the upper enclosure can be assembled first, and then the optical enclosure is assembled.

In one embodiment, the upper enclosure includes assembly mid-piece 130, walls 112 and 114, and ceiling 110. The upper enclosure provides the appropriate hermeticity for components therein. In one embodiment, upper enclosure includes a Peltier cooler 125 and electronic components 120 such as, for example, a thermistor, an integrated circuit, temperature control circuitry, signal processing device, a multiplexer, laser diode driver, micro-controller, etc. Peltier cooler 125 is not required to practice the invention; however, Peltier cooler 125 may provide better temperature control or heat dissipation than other embodiments without a Peltier cooling device. In alternate embodiments, other types of electronic heat dissipation devices may be used. Also, in alternative embodiments, the upper enclosure may include Pettier coder 125 or some other heat dissipation device and not include electronics components 120.

Instead of a heat dissipation device, upper enclosure may include a heat controlling device, such as a heating element for generating heat or a heat stabilization element to help stabilize the heat in the lower enclosure.

Heat sink 105 is attached to ceiling 110 in any manner known in the art. Heat sink 105 is illustrated as a fin-type heat sink; however, any type of heat sink may be used.

One or more openings (not shown in FIG. 1) may provided between the upper and lower enclosures to provide a connection between components in each enclosure. In one embodiment, the opening(s) between the enclosures are sealed such that the hermetic environment of each environment enclosure is preserved.

Figure 2:
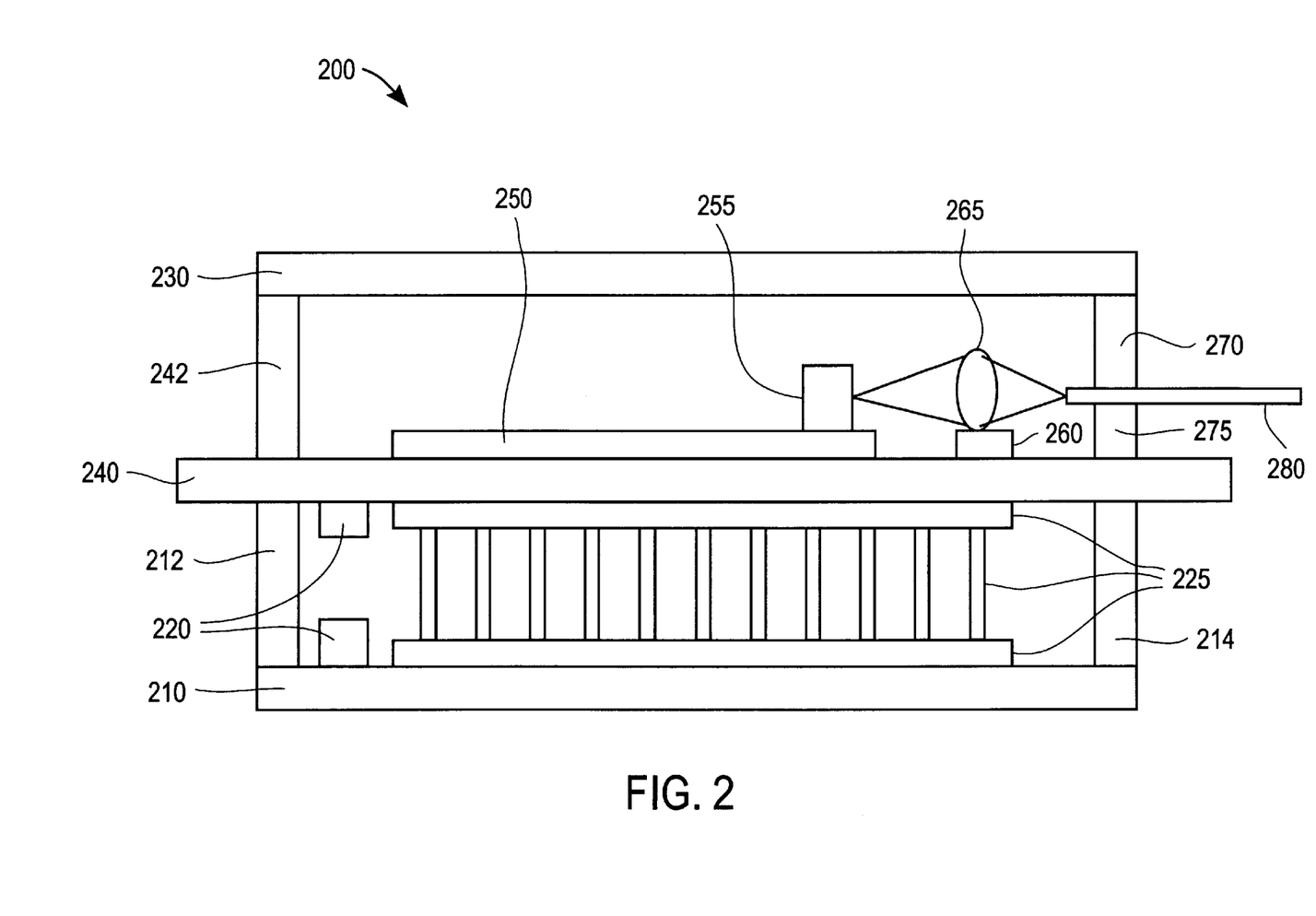
FIG. 2 is a side-section view of an alternative embodiment of an optoelectronic package.

FIG. 2 is a side view of one embodiment of an optoelectronic package. Assembly 200 is a dual enclosure optoelectronic package similar to the package described in FIG. 1 except the optical components are in an upper enclosure instead of the lower enclosure and the lower enclosure includes the heat dissipation devices. The two enclosures are coupled together using a substrate.

Referring to FIG. 2, in one embodiment, the optoelectronic and/or optical components are included in the upper enclosure in the same manner as in FIG. 1. For instance, within the upper enclosure, a heat spreader 250 and support 260 rest on assembly mid-piece 240. Heat spreader 250 operates to dissipate and spread the heat from optical component 255 (e.g., a laser diode). Support 260 operates to optically align optical component 265 (e.g., a lens) with optical fiber 280 and optical component 255. Not all optical components require support 260 to provide proper alignment. In alternative embodiments, a different number of optical components are included in the optical enclosure.

The upper enclosure includes assembly mid-piece 240, side walls 242, 270 and 275, and ceiling 230. In one embodiment, side walls 270 and 275 provide an opening for optical fiber 280; however, a single side wall can be used rather than two partial side walls. The opening provided for optical fiber 280 is sealed to provide the proper hermeticity for the upper enclosure.

Mid-piece 240 in FIG. 2 acts as both the substrate for transferring electrical signals to components in the upper enclosure as well as act as a mid-piece between the two enclosures. Thus, the distribution of ele pins outside the upper enclosure from interior components is accomplished by a set of vias through the bottom of mid-piece 240, such as described above in conjunction with FIG. 1. In one embodiment, the vias comprise hermetically filled vias. In an alternative embodiment, electrical connections are provided by a set of lines printed directly on the top and bottom of mid-piece 240 as a set of patterns. The top and bottom electrically conductive patterns are electrically connected by the vias. Using the vias, signals from the upper enclosure may be distributed to pins at the periphery of the package or to electronic components 220 located in the lower enclosure.

The lower enclosure includes substrate 210, side walls 212 and 214 and assembly mid-piece 240. In one embodiment, a Peltier cooler 225 and electronic components are disposed within the lower enclosure; however, as discussed above, Peltier cooler 225 is not required to practice the invention. Peltier cooler 225 transfers heat from assembly mid-piece 240, which has been generated by the optical components in the upper enclosure. In one embodiment, Peltier cooler 225 is attached to the top and bottom of the lower enclosure using glue or any other well-known attachment mechanism (e.g., solder).

In one embodiment, assembly mid-piece 240 extends beyond side walls 212 and 214 to provide a support for electronical connections at the periphery of the device. A heat sink or other heat dissipation device may be attached to the lower enclosure or to assembly mid-piece 240 to provide additional heat dissipation capacity. In an alternative embodiment, assembly mid-piece 240 has a width equal to bottom 210.

Mid-piece 240, side walls 212 and 214, and bottom 210 are assembled in any manner known in the art to provide the proper hermeticity for the heat dissipation components. In one embodiment, the lower enclosure has a low hermeticity. In one embodiment, side walls 212 and 214 and bottom 210 comprise a single piece of material that covers mid-piece 240.

In one embodiment, mid-piece 240 comprises a ceramic substrate. Assembly mid-piece 240 may include one or more openings (not shown in FIG. 2) to allow one or more connections between components in the enclosures. The opening(s) are sealed to provide the desired hermeticity for the lower enclosure and the upper enclosure.

Figure 3:
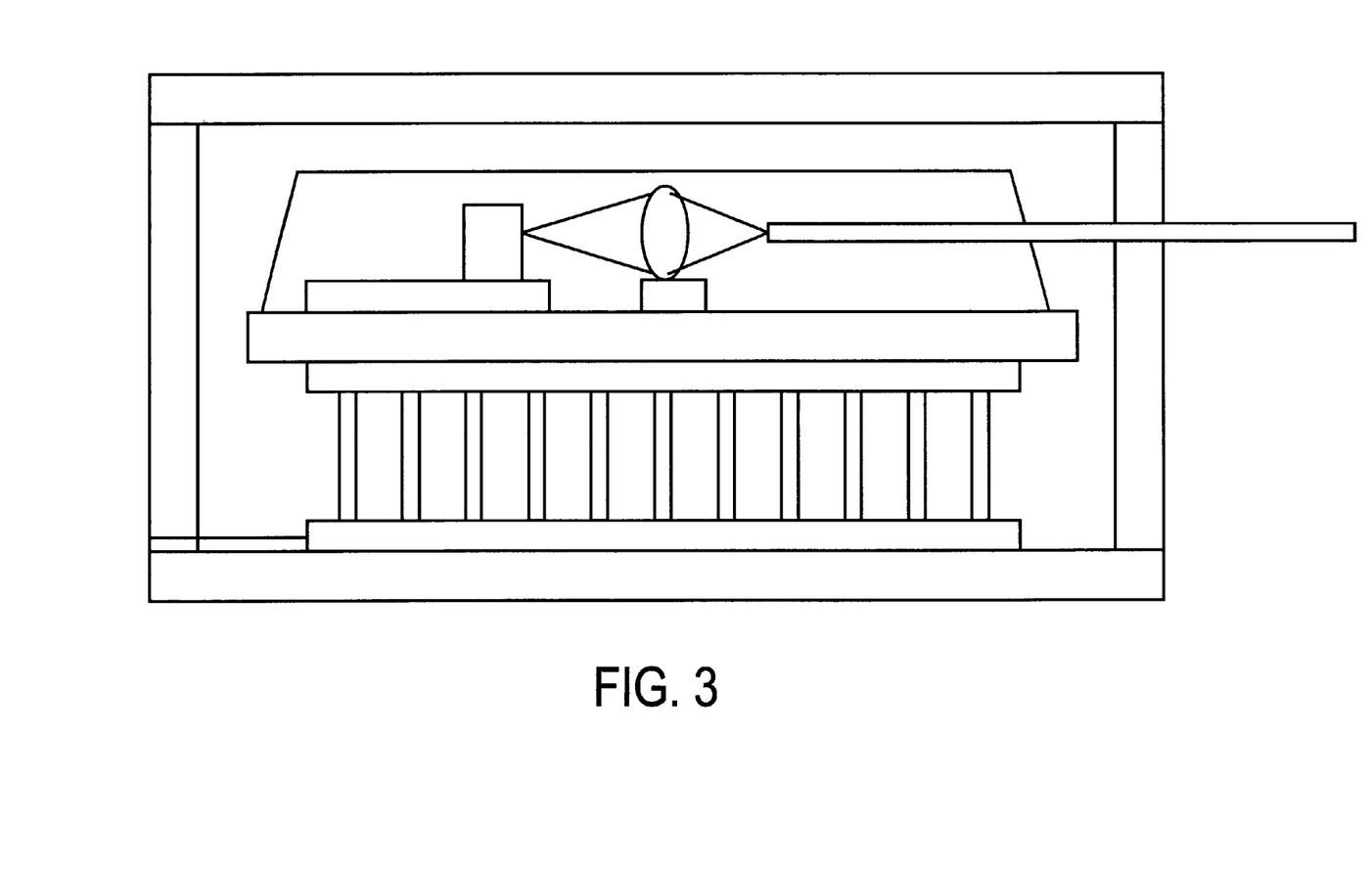
FIG. 3 is a side-section view of still another embodiment of an optoelectronic package.

FIG. 3 is an alternative embodiment of a dual-enclosure assembly shown in FIG. 2. Referring to FIG. 3, the enclosure containing the optical components is completely within the package and essentially within the enclosure containing the one or more heat dissipation devices. This embodiment provides a double wall of protection from the optical component to the exterior of the package, which increases reliability and facilitates accurate temperature control of the inside enclosure.

Figure 4:
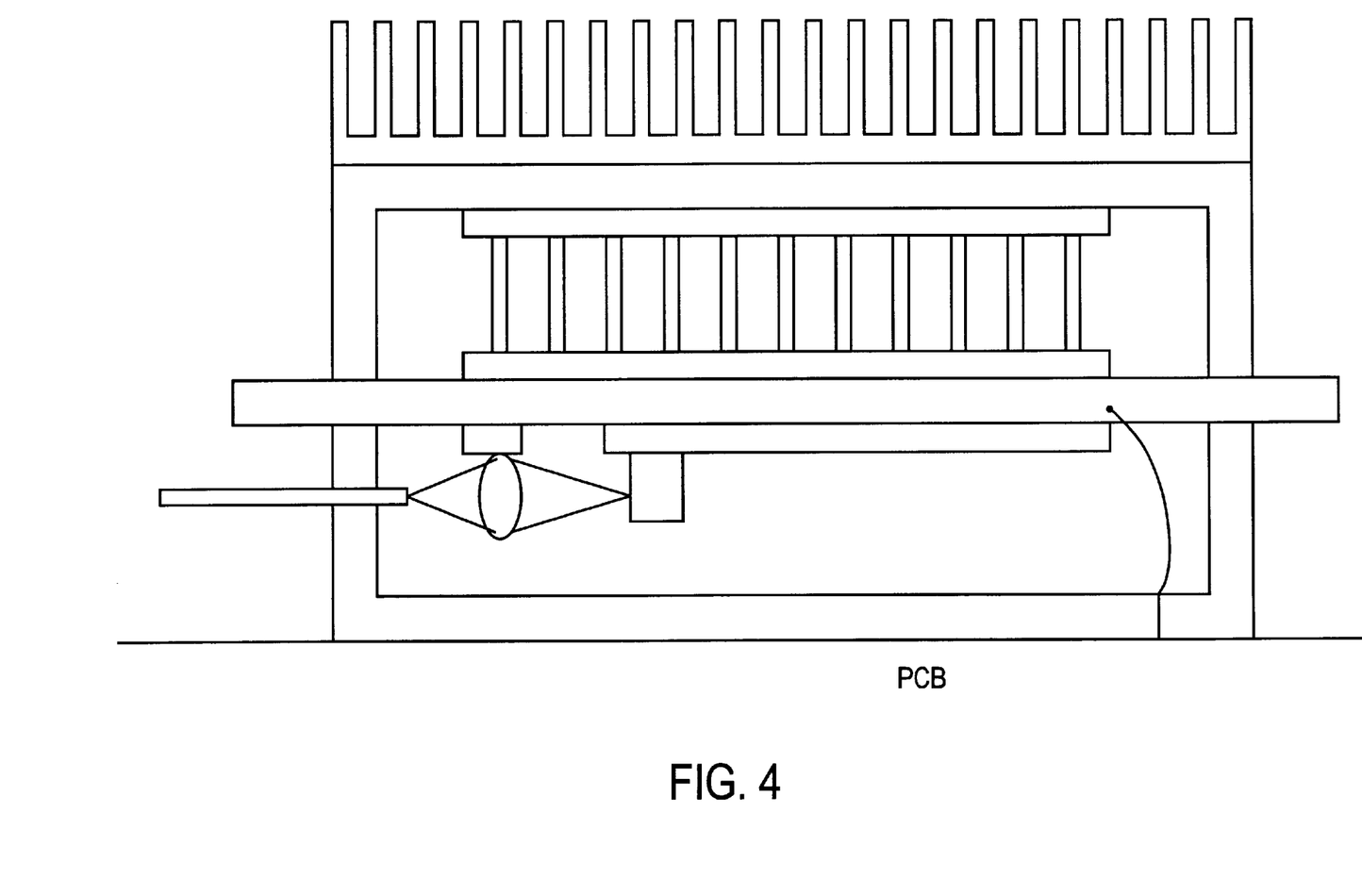
FIG. 4 is a side-section view of a further embodiment of an optoelectronic package.

FIG. 4 illustrates an alternative embodiment of the package. Referring to FIG. 4, the package is similar to the package shown in FIG. 1 except the and optoelectronic and optical components in the lower enclosure are attached to the upper portion of the lower enclosure, instead of the lower portion. In one embodiment, in such a case, the lower enclosure has a height that is short enough so that connections from the upper portion of the lower enclosure to the board on which the package is mounted allows for high speed devices to be used in the package. For example, the height (thickness) of the enclosure is limited to a few millimeters.

Although embodiments of optoelectronic packages are described herein having one or more optical elements on platforms, it is well within the teaching of the invention to position such elements on the package floor while having other optical elements of the package mounted below the top surface of the package floor.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. An optoelectronic package comprising:
   a first enclosure having at least one optical component and a heat pipe to direct heat away from the at least one optical component; and
   a second enclosure thermally coupled to the first enclosure and having at least one heat controlling device to control heat with respect to the first enclosure, wherein one of the first and second enclosures is disposed above the other of the first and second enclosures.

2. The optoelectronic package defined in claim 1 wherein the heat controlling device comprises a heat dissipating device to dissipate heat from the first enclosure.

3. The optoelectronic package defined in claim 1 wherein the heat controlling device comprises a heating device to provide heat to the first enclosure.

4. The optoelectronic package defined in claim 1 wherein the heat controlling device comprises a heat stabilizing device to stabilize heat within the first enclosure.

5. The package defined in claim 1 wherein the first and second are hermetic enclosures.

6. The optoelectronic package defined in claim 1 wherein the first enclosure is contains no organics.

7. The optoelectronic package defined in claim 1 wherein the first enclosure has no flux residue.

8. The optoelectronic package defined in claim 1 wherein the first enclosure is disposed above the second enclosure.

9. The optoelectronic package defined in claim 1 wherein the second enclosure is disposed above the first enclosure.

10. The optoelectronic package defined in claim 1 further comprising a heat sink thermally coupled to the second enclosure.

11. The optoelectronic package defined in claim 1 wherein the first and second enclosures are attached through a common structure through which heat is dissipated.

12. The optoelectronic package defined in claim 11 wherein the common structure comprises a wall shared between the first and second enclosures.

13. The optoelectronic package defined in claim 11 wherein the common structure comprises a substrate.

14. An optoelectronic package comprising: a first enclosure having at least one optical component and a heat pipe to direct heat away from the at least one optical component; and
   a second enclosure thermally coupled to the first enclosure and having at least one heat controlling device to control heat with respect to the first enclosure, wherein the first and second enclosures are attached through a common structure through which heat is dissipated, wherein the common structure comprises a substrate that includes one or more openings for one or more electrical connections.

15. The optoelectronic package defined in claim 14 wherein the one or more openings comprises one or more hermetic vias.

16. An optoelectronic package comprising:
   a first enclosure having at least one optical component and a heat pipe to direct heat away from the at least one optical component; and
   a second enclosure thermally coupled to the first enclosure and having at least one heat controlling device to control heat with respect to the first enclosure, wherein the first and second enclosures are attached through a common structure through which heat is dissipated, wherein the common structure comprises a substrate that forms a hermetic wall between the first and second enclosures.

17. The optoelectronic package defined in claim 1 wherein the heat dissipation device comprises a Peltier cooling device.

18. The optoelectronic package defined in claim 1 wherein the hermeticity of the first enclosure is greater than the hermeticity of the second enclosure.

19. The optoelectronic package defined in claim 1 further comprising a via between the first enclosure and the second enclosure to enable electrical connection to the optical component.

20. The optoelectronic package defined in claim 1 wherein the first enclosure further comprises a heat spreader thermally coupled to an optical component and the heat pipe.

21. An optoelectronic package comprising:
   a first enclosure having at least one optical component and a heat pipe to direct heat away from the at least one optical component, wherein the first enclosure further comprises a substrate having at least one via through which at least one electrical connection is fed to an optical component in the first enclosure; and
   a second enclosure thermally coupled to the first enclosure and having at least one heat controlling device to control heat with respect to the first enclosure.

22. A dual-enclosure optoelectronic package comprising:
   a substrate;
   a first enclosure formed on the substrate, the first enclosure having
      a first plurality of side walls,
      an assembly mid-piece,
      a heat spreader disposed within the first enclosure, and
      a heat pipe to conduct heat between the head spreader and the assembly mid-piece;
   an optical component disposed within the first enclosure, the optical component thermally coupled to the heat spreader;
   a second enclosure thermally coupled to the assembly mid-piece, the second enclosure having at least one heat dissipation device to dissipate heat generated by the optical component from the first enclosure.

23. The package defined in claim 22 wherein the first enclosure has no flux residues.

24. The package defined in claim 22 wherein the first enclosure contains no organics.

25. The package defined in claim 22 wherein the at least one dissipation device comprises a Peltier cooling device to conduct heat from the first enclosure to the ceiling of the second enclosure.

26. The package defined in claim 22 further comprising a heat sink thermally coupled to the ceiling of the second enclosure.

27. The package defined in claim 22 wherein the substrate provides electrical connections from outside the first enclosure to inside the first enclosure.

28. The package defined in claim 22 wherein plurality of sidewalls form a hermitic cap over the optical component.

29. The package defined in claim 22 wherein the second enclosure comprises a hermetic cap.

30. The package defined in claim 22 wherein the substrate forms a hermetic wall for both the first and second enclosures.

31. A dual-enclosure optoelectronic package comprising:
   a substrate;
   a first enclosure coupled to the substrate, the first enclosure having
      a first plurality of side walls,
      a ceiling formed by an assembly mid-piece, and
      a Peltier cooling device;
   a second enclosure coupled to the assembly mid-piece, the second enclosure having
      a second plurality of side walls,
      a ceiling formed by the assembly mid-piece,
      a heat spreader disposed within the second enclosure,
      a heat pipe to conduct heat between the head spreader and the ceiling, and
      an optical component thermally coupled to the heat spreader.

32. An optoelectronic package comprising:
   a first enclosure having at least one optical component and a heat pipe to direct heat away from the at least one optical component having an electrical connection; and
   a second enclosure thermally coupled to the first enclosure and having at least one heat dissipating device to dissipate heat from the first enclosure, wherein the heat dissipating device dissipates heat from the first enclosure such that a majority of the heat is dissipated in a direction of a side of the optical component opposite to the electrical connection, wherein one of the first and second enclosures is disposed above the other of the first and second enclosures.

33. The optoelectronic package defined in claim 32 wherein the first enclosure has no flux residue.

34. The optoelectronic package defined in claim 32 wherein the first enclosure has no organics.

35. The optoelectronic package defined in claim 32 further comprising a heat sink thermally coupled to the second enclosure.

36. The optoelectronic package defined in claim 32 wherein the first and second enclosures are attached through a common structure through which heat is dissipated.

37. The optoelectronic package defined in claim 36 wherein the common structure comprises a wall shared between the first and second enclosures.

38. The optoelectronic package defined in claim 36 wherein the common structure comprises a substrate.

39. An optoelectronic package comprising:
   a first enclosure having at least one optical component and a heat pipe to direct heat away from the at least one optical component having an electrical connection; and
   a second enclosure thermally coupled to the first enclosure and having at least one heat dissipating device to dissipate heat from the first enclosure, wherein the heat dissipating device dissipates heat from the first enclosure such that a majority of the heat is dissipated in a direction of a side of the optical component opposite to the electrical connection, wherein one of the first and second enclosures is disposed above the other of the first and second enclosures, wherein the common structure comprises a substrate to route electrical connections from the package.

40. The optoelectronic package defined in claim 32 wherein the heat dissipation device comprises a Peltier cooling device.

41. The optoelectronic package defined in claim 1 wherein the first enclosure further comprises a heat spreader thermally coupled to an optical component and the heat pipe.

42. An optoelectronic package comprising:
   a first enclosure having at least one optical component coupled to top side of the first enclosure, a heat pipe to direct heat away from the at least one optical component, and an electrical connection routed from the optical component to a bottom side of the first enclosure; and
   a second enclosure thermally coupled to the first enclosure and having at least one heat dissipating device to dissipate heat from the first enclosure.

43. The optoelectronic package defined in claim 42 wherein the heat controlling device comprises a heat dissipating device to dissipate heat from the first enclosure.

44. The optoelectronic package defined in claim 42 wherein the heat controlling device comprises a heating device to heat the first enclosure.

45. The optoelectronic package defined in claim 42 wherein the second enclosure is disposed above the first enclosure.

46. The optoelectronic package defined in claim 42 further comprising a heat sink thermally coupled to the second enclosure.

47. The optoelectronic package defined in claim 42 wherein the first and second enclosures are attached through a common structure through which heat is dissipated.

48. The optoelectronic package defined in claim 47 wherein the common structure comprises a wall shared between the first and second enclosures.

49. The optoelectronic package defined in claim 42 wherein the heat dissipation device comprises a Peltier cooling device.

50. The optoelectronic package defined in claim 42 wherein the hermeticity of the first enclosure is greater than the hermeticity of the second enclosure.

51. The optoelectronic package defined in claim 42 further comprising a via between the first enclosure and the second enclosure to enable electrical connection to the optical component.

52. The optoelectronic package defined in claim 42 wherein the first enclosure further comprises a heat spreader thermally coupled to an optical component and the heat pipe.

53. The optoelectronic package defined in claim 42 wherein the first enclosure further comprises a substrate having at least one via through which at least one electrical connection is fed to an optical component in the first enclosure.

54. The optoelectronic package defined in claim 42 wherein the heat controlling device comprises a heat stabilizing device to stabilize heat within the first enclosure.

55. The package defined in claim 42 wherein the first and second are hermetic enclosures.

56. The optoelectronic package defined in claim 42 wherein the first enclosure is contains no organics.

57. The optoelectronic package defined in claim 42 wherein the first enclosure has no flux residue.

58. An optoelectronic package comprising:
   a first enclosure having at least one optical component and a heat pipe to direct heat away from the at least one optical component; and
   a second enclosure thermally coupled to and enclosing the first enclosure and having at least one heat dissipating device to dissipate heat from the first enclosure, the first enclosure being disposed above the at least one dissipating device.

* * * * *

UNITED STATES PATENT AND TRADEMARK OFFICE
CERTIFICATE OF CORRECTION

PATENT NO.   : 6,252,726 B1  
DATED        : June 26, 2001  
INVENTOR(S)  : Verdiell Page 1 of 1

It is certified that error appears in the above-identified patent and that said Letters Patent is hereby corrected as shown below:

Column 2,
Line 7, delete "optoelecironic", insert -- optoelectronic --.

Column 3,
Line 61, delete "15", insert -- 155 --.

Column 5,
Line 34, delete "ele", insert -- electrical signals to --.
Line 49, insert -- 220 -- before "are disposed".

Column 6,
Line 22, delete "and" after "FIG. 1 except the".

Signed and Sealed this

Seventh Day of May, 2002

Attest:

Attesting Officer

JAMES E. ROGAN  
Director of the United States Patent and Trademark Office